United States Patent [19]

Setsune

[11] Patent Number: 4,464,597
[45] Date of Patent: Aug. 7, 1984

[54] SURFACE ACOUSTIC WAVE DEVICE COMPRISING AN INTERDIGITAL TRANSDUCER HAVING OMITTED FINGERS

[75] Inventor: Kentaro Setsune, Sakai, Japan

[73] Assignee: Matsushita Electric Industrial Co., Ltd., Osaka, Japan

[21] Appl. No.: 343,175

[22] Filed: Jan. 27, 1982

[30] Foreign Application Priority Data

Feb. 4, 1981 [JP] Japan .................................. 56-16169
Jun. 16, 1981 [JP] Japan .................................. 56-93598

[51] Int. Cl.$^3$ .......................................... H01L 41/04
[52] U.S. Cl. ............................ 310/313 B; 310/313 C; 333/154; 333/193
[58] Field of Search ....................... 310/313 A–313 D; 333/151, 154, 194, 195, 193

[56] References Cited

U.S. PATENT DOCUMENTS 3,866,154 2/1975 Moore .............................. 333/30 R
4,146,808 3/1979 Laker et al. ..................... 310/313 B

FOREIGN PATENT DOCUMENTS 2950896 6/1981 Fed. Rep. of Germany ...... 333/194

OTHER PUBLICATIONS

Cross, P. E. et al., "Design & Applications of 2-Part SAW Resonators on YZ-LiNbO$_3$", Proc. IEEE, vol. 64, No. 5, May 1976.
Cole, T. W., "A Directional Surface Wave Transducer", Proc. of IREE Aust., vol. 39, No. 2, Mar. 1978.

Primary Examiner—J. D. Miller
Assistant Examiner—D. L. Rebsch
Attorney, Agent, or Firm—Stevens, Davis, Miller & Mosher

[57] ABSTRACT

A withdrawal transducer structure is employed in a narrow-band surface acoustic wave device requiring many pairs of interdigital transducer fingers or in a high-frequency surface acoustic wave device in which the thickness of interdigital transducer fingers is large relative to the wavelength of the surface acoustic wave, so that the interdigital transducer fingers may not severely adversely affect the characteristics of the device. The interdigital transducer fingers in the input and output piezoelectric transducers are suitably partly omitted leaving some of them or dummy fingers are additionally provided to eliminate the adverse effect of the interdigital transducer fingers on the characteristics of the device, so that the narrow-band or high-frequency surface acoustic wave device can operate with improved performance without having any unnecessary frequency response.

8 Claims, 10 Drawing Figures

SURFACE ACOUSTIC WAVE DEVICE COMPRISING AN INTERDIGITAL TRANSDUCER HAVING OMITTED FINGERS

This invention relates to a surface acoustic wave device.

The prior art and the present invention will be described with reference to the accompanying drawings, in which.

Figure 1:
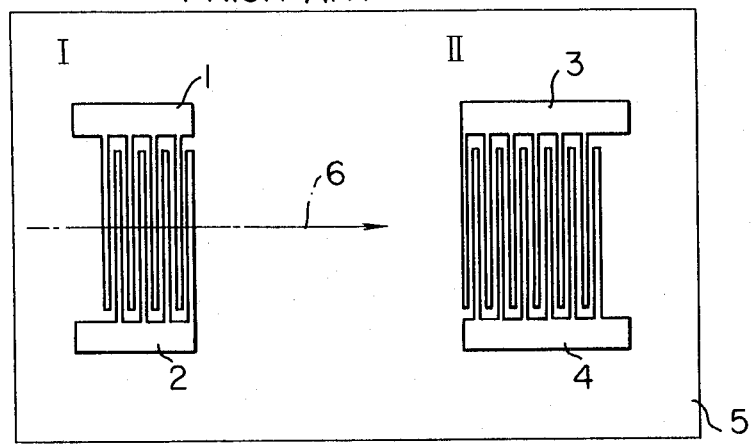
FIG. 1 shows the structure of a surface acoustic wave device commonly used hitherto in this field.

In a surface acoustic wave device commonly used heretofore in the art, piezoelectric transducers I and II are formed by interdigital transducer patterns 1 and 2 or 3 and 4 as shown in FIG. 1 for the purpose of conversion between an electrical signal and a mechanical signal, and such a device finds various applications including filters and delay lines. A single crystal of quartz or like material, a piezoelectric ceramic material or a piezoelectric medium of thin film structure such as a film of zinc oxide (ZnO) is commonly used to provide a substrate 5 of the surface acoustic wave device, and interdigital transducer patterns similar to those shown in FIG. 1 are commonly employed when any one of such materials is used to provide the substrate 5. These transducer patterns are formed by evaporating an electrical conductive metal such as aluminum (Al) or gold (Au) on one of the surfaces of the substrate 5 and then selectively etching away unnecessary metal portions according to the technique of photolithography. The thickness of the evaporated metal film is generally on the order of 500 Å to 3,000 Å.

There is the relation $f \times L = V$ among the frequency $f$ of a surface acoustic wave propagating along the surface of the substrate 5, the velocity $V$ of the propagating surface acoustic wave and the period $L$ of the interdigital transducer fingers. Due to the fact that the velocity $V$ is primarily determined by the material selected to form the substrate 5, the period $L$ is selected to be large when the frequency $f$ is low, but the period $L$ is made progressively smaller with an increase in the frequency $f$. Suppose, for example, that V673,000 m/sec. Then, $L$ is selected to be $L = 3$ μm at $f \approx 1$ GHz. Generally, the efficiency of electro-mechanical signal conversion is high when the width of the interdigital transducer fingers having the period $L$ is selected to be $L/4$. Thus, the width of the interdigital transducer fingers is selected to be 0.75 μm when $L = 3$ μm. On the other hand, the wavelength of the surface acoustic wave excited by the interdigital transducer fingers having the period $L$ is equal to $L$. Therefore, as the frequency $f$ of the surface acoustic wave becomes higher, the ratio of the film thickness of the interdigital transducer fingers to the width $D$ of the interdigital transducer fingers becomes correspondingly larger. As a result, there appears a greater difference between the acoustic impedance at the portions of the elastic material substrate surface where the interdigital transducer fingers are formed and the portions where such fingers are not formed.

Figure 2A:
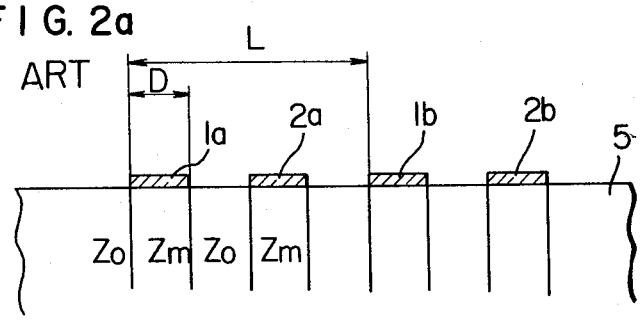
FIGS. 2a and 2b illustrate how the characteristics of the surface acoustic wave device shown in FIG. 1 are affected by the arrangement of the interdigital transducer fingers.

Appearance of such a greater difference in the acoustic impedance will be explained with reference to FIG. 2a. FIG. 2a is an enlarged schematic sectional view of the piezoelectric transducer I when the section is taken along the one-dot chain line 6 in FIG. 1. In FIG. 2a, reference numerals 1a, 1b, 2a and 2b designate the interdigital transducer fingers (electrodes) of the piezoelectric transducer I, and 5 designates the elastic material substrate such as piezoelectric substrate. The value of the velocity $V$ of the surface acoustic wave is $Vs$ which is determined by the material of the substrate 5, when other substances are not present on the substrate surface. On the other hand, when another substance in thin film form is present on the substrate surface, the value of the velocity $V$ of the surface acoustic wave is $Vm$ which differs from $Vs$ due to the specific gravity, elastic constant, etc. of the film. The difference between the values $Vm$ and $Vs$ becomes greater as the ratio of the thickness of the film to the wavelength of the surface acoustic wave becomes larger. This is equivalently expressed by the impedance against the surface acoustic wave in FIG. 2a to illustrate a discontinuity of the impedance. As described hereinbefore, the width $D$ of the interdigital transducer fingers is generally selected to be $L/4$. Therefore, the length of the portions having the impedance $Zo$ is approximately equal to that of the portions having the impedance $Zm$, in the direction of propagation of the surface acoustic wave along the surface of the piezoelectric substrate 5, and the value of the velocity $V$ of the surface acoustic wave in the area of the piezoelectric transducer I is between $Vm$ and $Vs$. This velocity $V$ can be expressed as follows, using the width $D$ of the interdigital transducer fingers:

$$V = \frac{Vs}{\frac{2D}{L}\left(\frac{Vs}{Vm} - 1\right) + 1}$$

The above expression teaches that the greater the ratio of the film thickness of the interdigital transducer fingers to the wavelength of the surface acoustic wave, the interdigital transducer fingers exert a greater influence on the velocity $V$ of the surface acoustic wave. Also, due to the fact that the period $L$ is made shorter with the increase in the operating frequency of the surface acoustic wave device, the velocity $V$ of the surface acoustic wave changes with the frequency $f$ even when the film thickness of the interdigital transducer fingers formed on the substrate surface is maintained constant. The velocity $V$ of the surface acoustic wave will not substantially change and the design will be facilitated when the film thickness of the interdigital transducer fingers is made smaller with the increase in the frequency $f$ of the surface acoustic wave so as to attain the relation $Vm \approx Vs$. However, at a film thickness smaller than a certain limit, the electrical resistance of the interdigital transducer fingers increases beyond an allowable limit, resulting in an insertion loss of the surface acoustic wave device. Further, in order to satisfy or meet the characteristics specifically demanded for such a device, the interdigital transducer fingers are designed in various patterns. In such a case, the interdigital transducer fingers may not be periodically arranged.

Figure 2B:
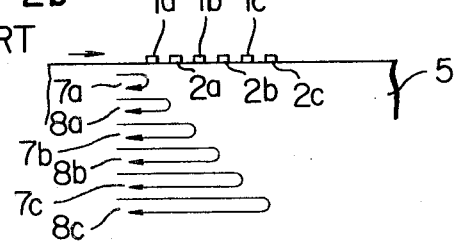

Further, mechanical reflection of the surface acoustic wave occurs at the discontinuous portions described hereinbefore. FIG. 2b illustrates occurrence of such a mechanical reflection. FIG. 2b is also a schematic sectional view of the piezoelectric transducer I when the section is taken along the one-dot chain line 6 in FIG. 1. In FIG. 2b, reference numerals 1a, 1b and 1c designate the fingers (digit electrodes) of the interdigital transducer pattern 1, and reference numerals 2a, 2b and 2c designate the fingers of the interdigital transducer pattern 2. These interdigital transducer fingers are formed on one of the surfaces of the substrate 5. In FIG. 2b, the surface acoustic wave is incident upon the transducer I from the left-hand side and is reflected by the rising edges of the discontinuous portions of the individual interdigital transducer fingers 1a, 1b, 1c, 2a, 2b and 2c as indicated by 7a, 7b, 7c, 8a, 8b and 8c respectively. The interdigital transducer patterns 1 and 2 are generally disposed in a relation spaced apart from each other by L/2 in order to ensure a high efficiency of electromechanical signal conversion. Therefore, the fingers 1a, 1b and 1c are spaced apart from the fingers 2a, 2b and 2c by L/2 respectively. In other words, it can be said that the latter are displaced from the former by 180° ($\pi$ radians) in terms of the phase of the surface acoustic wave. Accordingly, when the phase of the reflected wave portions 7a, 7b, 7c, 8a, 8b and 8c is considered, all of these reflected wave portions have a phase which is an integer times the angle of 360° ($2\pi$ radians). Thus, the reflected wave portions are added together in the same phase, with the result of causing an intense reflected wave to the incident surface acoustic wave. Such a reflected wave propagates between the input and output piezoelectric transducers formed by the interdigital transducer fingers thereby producing a multiplex reflection signal which will cause an unnecessary response of the filter characteristic and phase characteristic of the device. Further, when this adverse effect is excessively large, increased multiplex reflection will occur in each of the piezoelectric transducers to cause derangement of the various characteristics of that piezoelectric transducer. The adverse effect of reflection of this kind is especially excessive in a high frequency range to such an extent that the design of high-frequency surface acoustic wave elements operating at a high frequency of the order of 1 GHz is practically impossible unless the adverse effect is completely eliminated. Although such an objectionable effect may be eliminated by thinning the film thickness of the evaporated conductive metal film, the thinning of the film thickness results in an undesirable increase in the sheet resistance of the evaporated conductive metal film, as described hereinbefore. This increased sheet resistance reduces the electro-mechanical and mechano-electrical signal conversion efficiency of the piezoelectric transducers and provides a source of an insertion loss of the surface acoustic wave device.

Further, the rate of mechanical reflection above described increases in proportion to the number of transducer fingers and provides a great obstruction against the development and realization of an element such as a narrow-band surface acoustic wave filter element requiring many transducer finger pairs or an element employing a substrate of material such as quartz having a small piezoelectric coupling constant.

Figure 3:
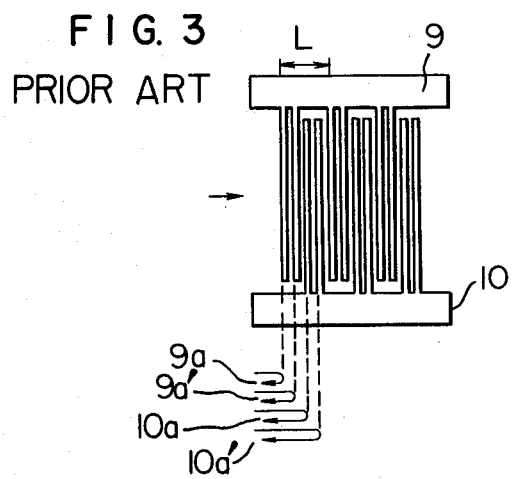
FIG. 3 shows a prior art transducer finger arrangement proposed for alleviating the adverse effect explained with reference to FIGS. 2a and 2b.

In an effort to solve the above problem, it has been proposed to split each of the interdigital transducer fingers shown in FIG. 1 into halves as shown in FIG. 3 so as to cancel the reflected portions of the incident surface acoustic wave. Referring to FIG. 3, four interdigital fingers counted from the left-hand end of the combination of interdigital transducer pattern 9 and 10 are spaced from each other by L/4 and are thus disposed at positions displaced from each other by 90° ($\pi/2$ radians) relative to a surface acoustic wave whose wavelength is L. Therefore, the four reflected wave portions 9a, 9a', 10a and 10a' of the incident surface acoustic wave reflected from the rising edges of the discontinuous portions of the four transducer fingers respectively have such a phasic relation that the reflected wave portions 9a', 10a and 10a' have the phase of 180°, 360° and 540° respectively relative to that of the reflected wave portion 9a, so that they are added together to be cancelled. Thus, in the piezoelectric transducer formed by the interdigital transducer patterns 9 and 10, the mode of reflection of the surface acoustic wave by one of the transducer fingers of the transducer pattern 9 and the associated one of the transducer fingers of the transducer pattern 10 is entirely similar to the mode of reflection by the four transducer fingers above described, and the phase of the former differs from that of the latter by 360°. Consequently, the wave portions reflected by all of the interdigital transducer fingers of the piezoelectric transducer are cancelled. However, according to the proposed prior art structure, the width of the transducer fingers must be ½ of that of the transducer fingers of conventional piezoelectric transducers operating at the same frequency, and this is disadvantageous from the technical aspect of finger formation in that the width thereof is extremely small. This is a very great technical problem for a piezoelectric transducer which operates at a high frequency higher than about 1 GHz. For example, a width as small as 0.375 $\mu$m is required for the transducer fingers when L=3 $\mu$m as described hereinbefore, and it is virtually impossible to mass-produce such transducer patterns as far as the present-day technique is concerned.

It is therefore a primary object of the present invention to provide a novel and improved narrow-band or high-frequency surface acoustic wave device in which the various adverse effects exerted by the prior art interdigital transducer structure on the characteristics of the device are eliminated by a simple design including withdrawal (omission) of part of the interdigital transducer fingers. The surface acoustic wave device according to the present invention is featured by the fact that conductive strips are additionally provided or the transducer fingers are partly withdrawn or omitted so that the ratio of the sum of the widths of the conductive strips and transducer fingers in the input piezoelectric transducer to the total length of the input piezoelectric transducer is made equal to the ratio of the sum of the widths of the conductive strips and transducer fingers in the output piezoelectric transducer to the total length of the output piezoelectric transducer, in the direction of propagation of the surface acoustic wave. The device according to the present invention is further featured by the fact that conductive strips not contributing to the piezoelectric conversion of the surface acoustic wave are suitably provided so that the portions of the incident surface acoustic wave reflected mechanically from the transducer fingers can be cancelled.

Therefore, according to one aspect of the present invention, there is provided a surface acoustic wave device comprising a piezoelectric transducer formed on one of the surfaces of a substrate of a Piezoelectric material and constituted by interdigital transducer patterns, each including a plurality of transducer fingers remaining as a result of partial withdrawal or omission from those periodically spaced apart from each other by a distance of L (the wavelength of a surface acoustic wave at the frequency of maximum response of said piezoelectric transducer), wherein a plurality of conductive strips not electrically connected to the common-connected fingers of said piezoelectric transducer are disposed in the finger-withdrawn space of said piezoelectric transducer in a relation that the first one of them is disposed at a position spaced apart by a predetermined distance from the position determined by the periodically spaced distance between said transducer fingers.

Preferred embodiments of the surface acoustic wave device according to the present invention will now be described in detail with reference to the drawings.

Figure 4:
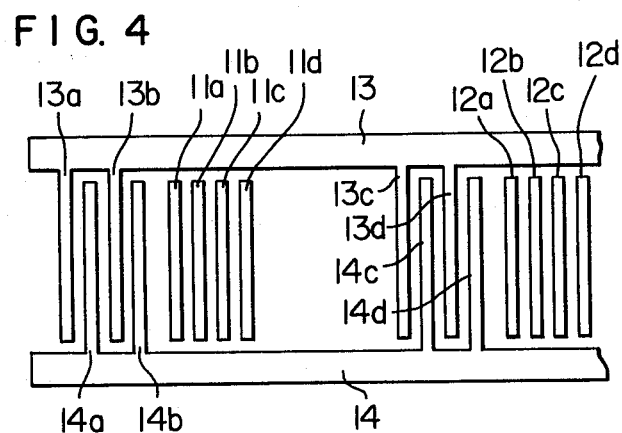
FIGS. 4 and 5 show preferred embodiments of the surface acoustic wave device according to the presnet invention.

FIG. 4 shows an embodiment of the surface acoustic wave device according to the present invention. Referring to FIG. 4, transducer patterns (comb-type electrodes) 13 and 14 having interdigital transducer fingers 13a to 13d and 14a to 14d respectively are formed on a substrate (not shown) to constitute a piezoelectric transducer. A conductive strip 11a is disposed in a relation spaced apart by a distance of ¾L from the transducer finger 14b which is spaced apart by a distance of L from the transducer finger 14a. A second conductive strip 11b is spaced apart by a distance of L/2 from the first conductive strip 11a, and a third conductive strip 11c and a fourth conductive strip 11d are similarly spaced apart by a distance of L/2 from the conductive strips 11b and 11c respectively. When a surface acoustic wave of wavelength L is incident upon such an interdigital transducer structure from, for example, the left-hand end of the structure, the phase of the portions of the surface acoustic wave reflected from the transducer fingers 13a, 13b, 14a and 14b differs by [180°+360°×n] (n is an integer) from that of the portions of the surface acoustic wave reflected from the conductive strips 11a, 11b, 11c and 11d, with the result that the reflected wave portions cancel each other. Conductive strips 12a, 12b, 12c and 12d, the number of which is generally preferably equal to the number of the transducer fingers 13c, 13d, 14c and 14d, are similarly disposed so as to cancel the reflected surface acoustic wave portions. In this manner, the adverse effect of mechanical reflection can be eliminated by arranging the conductive strips in each block so as to cancel the reflected surface acoustic wave portions. When the interdigital transducer fingers are disposed continuously as shown in FIG. 4, the first conductive strip 11a or 12a is preferably disposed in a relation spaced apart by a distance of ¾L from the last one 14b or 14d of the interdigital transducer fingers in each block. However, the increase in the distance between the center of the interdigital transducer fingers and the center of the conductive strips results in a narrowed frequency range in which the reflected surface acoustic wave portions can be cancelled. In such a case, the conductive strips are preferably divided into two groups disposed on the both sides respectively of the interdigital transducer finger group for achieving the effect of cancelling the reflected wave portions over a wide frequency band. In a surface acoustic wave device such as a narrow-band filter, its interdigital transducer fingers are generally partly withdrawn, that is, the number of the interdigital transducer fingers is decreased so as to alleviate the adverse effect of the transducer fingers on the incident surface acoustic wave without changing the total length of the piezoelectric transducers in the direction of propagation of the surface acoustic wave. However, when, for the purpose of eliminating the adverse effect of mechanical reflection in such a surface acoustic wave device, the conductive strips and transducer fingers remaining after withdrawal in each block are arranged in a relation similar to that described above, the arrangement can exhibit a great effect for cancelling the mechanically reflected portions of the surface acoustic wave.

Figure 5:
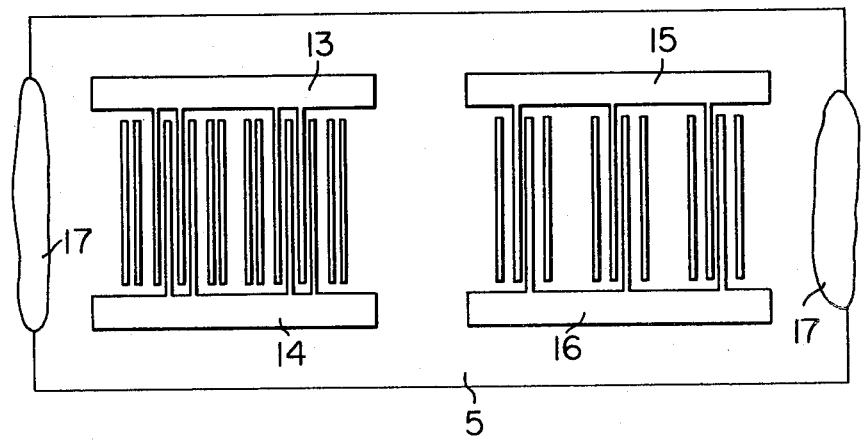

FIG. 5 shows another embodiment of the surface acoustic wave device of the present invention in which conductive strips are combined with interdigital transducer fingers remaining after withdrawal so as to form an input piezoelectric transducer and an output piezoelectric transducer. Referring to FIG. 5, the input piezoelectric transducer provided by interdigital transducer patterns 13 and 14 formed on one of the surfaces of a substrate 5 includes a plurality of conductive strips provided for cancelling reflected surface acoustic wave portions, and the output piezoelectric transducer provided by interdigital transducer patterns 15 and 16 formed on the same surface of the substrate 5 includes similar conductive strips. Layers of an absorbent 17 for the surface acoustic wave are coated on the longitudinal opposite ends of the substrate 5.

Figure 6A:
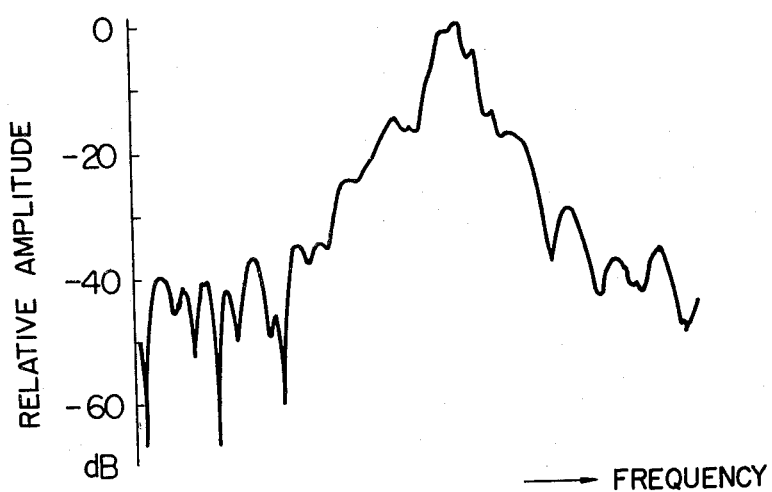
FIGS. 6a and 6b show the frequency response characteristics of the prior art device and the device of the present invention respectively.
Figure 6B:
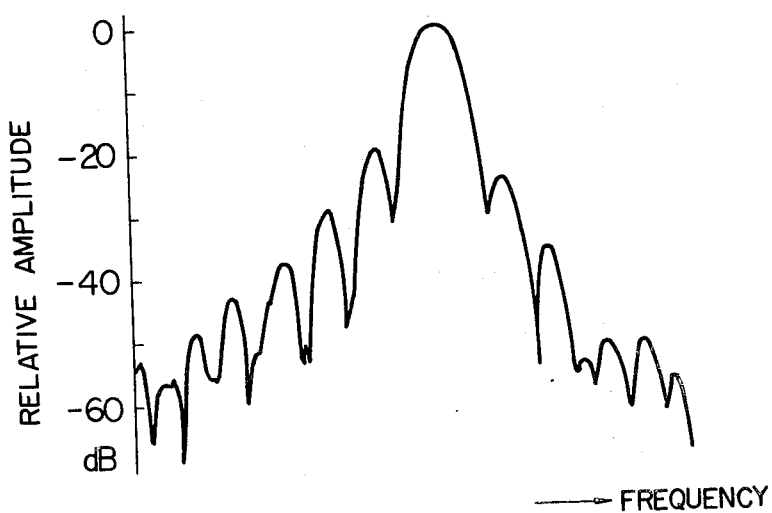

FIGS. 6a and 6b illustrate, by way of example, how the frequency response characteristic of a surface acoustic wave device can be improved by the provision of the conductive strips disposed according to the present invention. FIG. 6a represents the frequency response of a filter including a prior art interdigital transducer structure and exhibiting a band-pass characteristic of about 5 MHz in the vicinity of 1 GHz. On the other hand, FIG. 6b represents the frequency response of a surface acoustic wave filter in which the interdigital transducer fingers in the prior art arrangement are partly withdrawn, and conductive strips are disposed according to the present invention without changing the center frequency and band width. In each of these filters, its input and output piezoelectric transducers include normal interdigital transducer fingers of equal length. Therefore, both of these filters should exhibit the filter characteristic given by $$\frac{\sin X (f - fo)}{X (f - fo)},$$

where X (f−fo) is a function of the frequency (f−fo). It will be seen in FIG. 6a that the above filter characteristic is not observed in the case of the prior art filter, and the mechanical reflection of the surface acoustic wave exerts a very great adverse effect on the filter characteristic. In contrast, it will be seen in FIG. 6b that the above filter characteristic is observed in the case of the filter of the present invention, and it was confirmed that the conductive strips provided according to the present invention exhibited a very prominent effect.

The value of the velocity V of the surface acoustic wave in the output piezoelectric transducer differs from that in the input piezoelectric transducer when the rate of withdrawal of fingers in the output piezoelectric transducer differs from that in the input piezoelectric transducer, as in the device shown in FIG. 5. Let T be the total length of each of the input and output piezoelectric transducers in the direction of propagation of the surface acoustic wave, and W be the sum of the widths of the transducer fingers and conductive strips. Then, the velocity V of the surface acoustic wave in that transducer is expressed as $$V = \frac{V_s}{\frac{W}{T}\left(\frac{V_s}{V_m} - 1\right) + 1}$$

The value of W includes the lengths of conductive films in the direction of propagation of the surface acoustic wave when such conductive films are formed in the piezoelectric transducer in addition to the transducer fingers forming the interdigital transducer structure. It is apparent that, by maintaining constant the value of W/T, the velocities V of the surface acoustic wave in the input and output piezoelectric transducers are the same, thereby facilitating the design of the device operating at a specific frequency.

Figure 7:
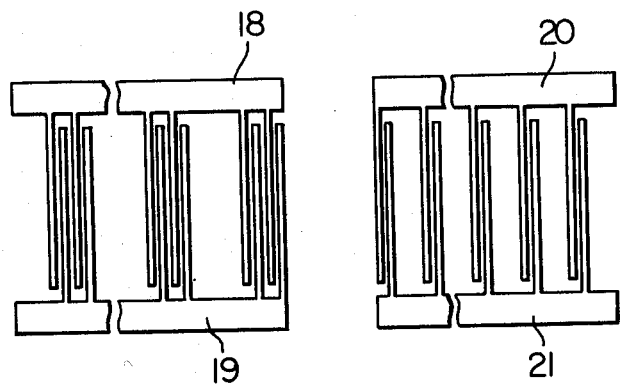
FIGS. 7 and 8 show other preferred embodiments of the surface acoustic wave device according to the present invention.

FIG. 7 shows another embodiment of the surface acoustic wave device according to the present invention. Referring to FIG. 7, interdigital transducer patterns 18 and 19 constitute an input piezoelectric transducer, and interdigital transducer patterns 20 and 21 constitute an output piezoelectric transducer. It will be seen that, in the device shown in FIG. 7, two pairs of interdigital transducer fingers are withdrawn from every four pairs of interdigital transducer fingers in the input piezoelectric transducer compared with the conventional normal interdigital transducer finger arrangement, and one pair of interdigital transducer fingers are similarly withdrawn from every two pairs of interdigital transducer fingers in the output piezoelectric transducer. The ratio R1 of the sum of the widths of the interdigital transducer fingers in the input piezoelectric transducer to the total length of the input piezoelectric transducer is given by $$\frac{DN}{L\left(2N - \frac{9}{4}\right)} = R1$$

where L is the wavelength of the surface acoustic wave, and N is the number of the interdigital transducer fingers. Similarly, the ratio R2 of the sum of the widths of the interdigital transducer fingers in the output piezoelectric transducer to the total length of the output piezoelectric transducer is given by $$\frac{DM}{L\left(2M - \frac{5}{4}\right)} = R2$$

where M is the number of the interdigital transducer fingers. These ratios R1 and R2 are approximately equal to each other when the values of N and M are considerably large. Suppose, for example, that N=20 and M=20. Then, R1/R2≈1.03, and it will be seen that the velocities V of the surface acoustic wave in the input and output piezoelectric transducers are approximately the same.

Figure 8:
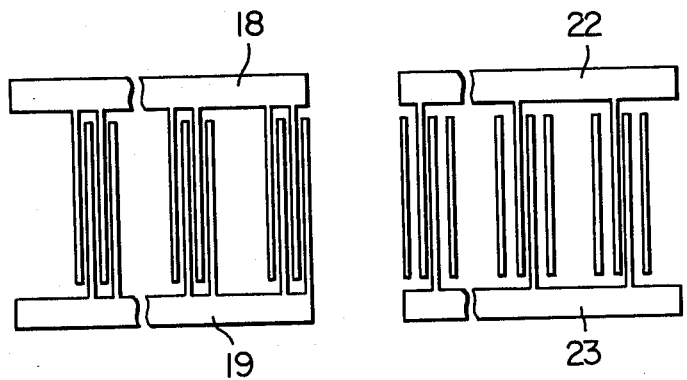

FIG. 8 shows a modification of the surface acoustic wave device of the present invention shown in FIG. 7. Referring to FIG. 8, the structure of the input piezoelectric transducer is the same as that shown in FIG. 7. However, the number of the interdigital transducer fingers in the output piezoelectric transducer shown in FIG. 8 is less than that shown in FIG. 7, and a plurality of conductive strips are added in the output transducer structure.

It will be understood from the foregoing detailed description that application of the interdigital transducer finger arrangement according to the present invention to surface acoustic wave devices operating at high frequencies, especially to a narrow-band filter including many interdigital transducer finger pairs or to a surface acoustic wave device employing a substrate of material such as quartz having a small piezoelectric coupling constant provides a great practical merit. The present invention is also advantageous in that the adverse effect of the interdigital transducer fingers on the frequency characteristics of the input and output piezoelectric transducers of the surface acoustic wave device can be substantially completely eliminated, and the losses including the insertion loss of the surface acoustic wave device can also be improved. Therefore, various surface acoustic wave devices of improved performance can be realized and mass-produced according to the present invention.

What is claimed is:

1. A surface acoustic wave device comprising a piezoelectric transducer formed on one of the surfaces of a substrate of a piezoelectric material, said transducer comprising at least one pair of opposing interdigital transducer patterns provided on said substrate, each including a plurality of commonly connected transducer fingers periodically spaced apart from each other by a distance of L in a surface acoustic wave propagating direction, where L is the wavelength of a surface acoustic wave at the frequency of maximum response of said piezoelectric transducer, some of said fingers in each of said patterns of said transducer being omitted to create a finger-free space within said transducer, and a plurality of conductive strips not electrically connected to the common-connected fingers of said piezoelectric transducer, said conductive strips being disposed sequentially in said direction in the finger-free space of said piezoelectric transducer such that a width center of a first one of said strips is disposed spaced apart by a predetermined distance, which is a function of L, from a width center of a last one of said transducer fingers.

2. A surface acoustic wave device as claimed in claim 1, wherein width centers of said conductive strips are spaced apart from width centers of said transducer fingers by a distance of $$L \times \left(\frac{1}{4} + \frac{n}{2}\right),$$

where n is a positive integer.

3. A surface acoustic wave device as claimed in claim 1, wherein said predetermined distance is 3L/4 and the width of said conductive strips is the same as that of said transducer fingers.

4. A surface acoustic wave device as claimed in claim 2, wherein the number of said conductive strips in said piezoelectric transducer is equal to that of said transducer fingers of said interdigital transducer patterns.

5. A surface acoustic wave device as claimed in claim 2, wherein said conductive strips are formed on both sides of a group of said transducer fingers.

6. A surface acoustic wave device comprising at least one pair of an input piezoelectric transducer and an output piezoelectric transducer which are formed on one of the surfaces of a substrate of piezoelectric material, at least said input piezoelectric transducer comprising a pair of opposing interdigital transducer patterns including a plurality of transducer fingers and defining therebetween a space created by a partial omission of fingers from said patterns, where a ratio of the sum of the widths of said transducer fingers in said output piezoelectric transducer to a total length of said output piezoelectric transducer in the direction of propagation of a surface acoustic wave is selected to be approximately equal to a ratio of the sum of widths of said transducer fingers in said input piezoelectric transducer to a total length of said input piezoelectric transducer in said direction of propagation.

7. A surface acoustic wave device comprising at least one pair of an input piezoelectric transducer and an output piezoelectric transducer which are formed on one of the surfaces of a substrate of piezoelectric material and each of which comprises a pair of opposing interdigital transducer patterns including a plurality of transducer fingers and defining therebetween a space created by a partial omission of transducer fingers from said patterns, and a plurality of conductive strips formed in said space in at least one of said piezoelectric transducers independently of said transducer fingers in a relation that the ratio of the sum of the widths of said transducer fingers and any conductive strips formed in said output piezoelectric transducer to a total length of said output piezoelectric transducer in the direction of propagation of a surface acoustic wave is approximately equal to a ratio of the sum of widths of said transducer fingers and any conductive strips formed in said input piezoelectric transducer to a total length of said input piezoelectric transducer in said direction of propagation.

8. A surface acoustic wave device as claimed in claim 7, wherein said transducer fingers and conductive strips are sequentially disposed in said direction of propagation, the width of said conductive strips is the same as that of said transducer fingers and the width centers of said respective conductive strips are spaced apart from the width center of at least one of said transducer fingers by a distance of $$L \times \left( \frac{1}{4} + \frac{n}{2} \right),$$

where n is a positive integer, and L is the wavelength of the surface acoustic wave at the frequency of maximum response of said at least one piezoelectric transducer.

* * * * *